(12) United States Patent
Wengreen et al.

(10) Patent No.: US 8,896,768 B1
(45) Date of Patent: Nov. 25, 2014

(54) MOUNTING SYSTEMS FOR DIGITAL MEDIA PLAYERS

(71) Applicant: Innovelis, Inc., Sammamish, WA (US)

(72) Inventors: Brian Jeffrey Wengreen, Ravensdale, WA (US); Eric John Wengreen, Sammamish, WA (US)

(73) Assignee: Innovelis, Inc., Sammamish, WA (US)

( * ) Notice: Subject to any disclaimer, the term of this patent is extended or adjusted under 35 U.S.C. 154(b) by 0 days.

(21) Appl. No.: 14/478,665

(22) Filed: Sep. 5, 2014

Related U.S. Application Data

(63) Continuation of application No. 14/209,452, filed on Mar. 13, 2014, now Pat. No. 8,848,113, which is a continuation of application No. 14/169,148, filed on Jan. 30, 2014, which is a continuation of application No. 13/332,373, filed on Dec. 21, 2011, which is a continuation-in-part of application No. 13/278,759, filed on Oct. 21, 2011, now abandoned.

(60) Provisional application No. 61/416,736, filed on Nov. 23, 2010.

(51) Int. Cl.
*H04N 5/64* (2006.01)
*H05K 5/02* (2006.01)
*F16M 13/02* (2006.01)
*H05K 7/14* (2006.01)
*H04N 5/655* (2006.01)
*G06F 1/16* (2006.01)
*H04N 9/79* (2006.01)

(52) U.S. Cl.
CPC ............. *H05K 5/0204* (2013.01); *F16M 13/02* (2013.01); *H05K 7/14* (2013.01); *H04N 5/655* (2013.01); *G06F 1/1601* (2013.01); *H04N 5/64* (2013.01); *H04N 9/79* (2013.01); *G06F 1/16* (2013.01)
USPC .......................................... 348/836; 348/843

(58) Field of Classification Search
CPC ............ H04N 5/64; H04N 5/655; G06F 1/16; G06F 1/1601
USPC .................................................. 348/836, 846
See application file for complete search history.

(56) References Cited

U.S. PATENT DOCUMENTS

| | | |
|---|---|---|
| 1,618,573 A | 2/1927 | Cole |
| 2,584,646 A | 2/1952 | Wagstaff |
| 3,091,378 A | 5/1963 | O'Dwyer |
| 3,176,950 A | 4/1965 | Hittesdorf |
| 3,279,009 A | 10/1966 | Teasdale |
| 3,294,298 A | 12/1966 | Danielson |
| 3,477,679 A | 11/1969 | Lovitz |

(Continued)

OTHER PUBLICATIONS

Out of Sight Bracket—Website Part 1 (downloaded on Nov. 13, 2013 from http://www.outofsightbracket.com/OutOfSightBracket/Out_of_Sight_Bracket_for_Apple_TV.html). The website says the Out of Sight Bracket is "Patent Pending." The Out of Sight Bracket might have been made by Gordon H. Beckhart.

(Continued)

*Primary Examiner* — Geepy Pe

(57) ABSTRACT

Mounting systems can attach a digital media player to a television. Mounting systems can include a base, sidewalls, and hooks configured to enter vents of the television. Hooks can include a front portion that protrudes away from the base and into a vent of the television such that the hook attaches the base to the television.

20 Claims, 16 Drawing Sheets

(56) References Cited

U.S. PATENT DOCUMENTS

| | | | |
|---|---|---|---|
| 3,990,617 | A | 11/1976 | Carter |
| 4,519,656 | A | 5/1985 | Raz |
| 4,602,761 | A | 7/1986 | Carter |
| 4,697,780 | A | 10/1987 | Wenkman |
| 4,746,042 | A | 5/1988 | King |
| 4,771,927 | A | 9/1988 | Ventura |
| 4,825,590 | A | 5/1989 | Cullinane |
| 4,826,115 | A | 5/1989 | Novitski |
| 4,840,773 | A | 6/1989 | Wade |
| 4,852,843 | A | 8/1989 | Chandler |
| 4,974,764 | A | 12/1990 | Cantwell |
| 5,038,985 | A | 8/1991 | Chapin |
| 5,092,395 | A | 3/1992 | Amidzich |
| 5,273,690 | A | 12/1993 | McDowell |
| 5,297,318 | A | 3/1994 | Adolphson |
| D351,341 | S | 10/1994 | Hung |
| 5,400,990 | A | 3/1995 | Frankel |
| 5,535,093 | A | 7/1996 | Noguchi |
| 5,593,124 | A | 1/1997 | Wang |
| 5,619,395 | A | 4/1997 | McBride |
| 5,619,774 | A | 4/1997 | Perry |
| D388,107 | S | 12/1997 | Huckins |
| 5,850,998 | A | 12/1998 | Parsey |
| 5,899,371 | A | 5/1999 | Weliver |
| 5,914,707 | A | 6/1999 | Kono |
| 5,961,083 | A | 10/1999 | Hartman |
| 5,979,724 | A | 11/1999 | Loewenthal |
| 6,102,660 | A | 8/2000 | Lee |
| 6,105,923 | A | 8/2000 | Robertson |
| D443,493 | S | 6/2001 | Skeem |
| 6,275,885 | B1 | 8/2001 | Chin |
| 6,336,615 | B1 | 1/2002 | Jeon |
| D456,413 | S | 4/2002 | Malson |
| 6,485,144 | B1 | 11/2002 | Liao |
| 6,560,983 | B1 | 5/2003 | Schimmeyer |
| 6,691,374 | B2 | 2/2004 | Coyne |
| 6,888,940 | B1 | 5/2005 | Deppen |
| 6,939,641 | B2 | 9/2005 | Kincaid |
| 7,047,601 | B1 | 5/2006 | Vernon-Woods |
| 7,079,384 | B2 | 7/2006 | Wang |
| 7,113,218 | B2 | 9/2006 | Battles |
| 7,145,603 | B2 | 12/2006 | Whitby |
| D535,826 | S | 1/2007 | Toghanian |
| 7,222,762 | B2 | 5/2007 | Rees |
| D545,343 | S | 6/2007 | Braun |
| D560,411 | S | 1/2008 | Chung |
| D565,399 | S | 4/2008 | Grey |
| 7,367,089 | B2 | 5/2008 | Cooke |
| D570,801 | S | 6/2008 | Allen |
| D598,945 | S | 8/2009 | Gillespie |
| 7,580,255 | B2 | 8/2009 | Crooijmans |
| D624,949 | S | 10/2010 | Nakayama |
| D625,729 | S | 10/2010 | McNames |
| D628,611 | S | 12/2010 | Lewis |
| 7,854,420 | B2 | 12/2010 | Depay |
| D633,503 | S | 3/2011 | Bo |
| 7,959,121 | B1 | 6/2011 | Barnes |
| D657,362 | S | 4/2012 | Lister |
| D662,491 | S | 6/2012 | Andre |
| D667,411 | S | 9/2012 | Kim |
| 8,544,805 | B2 | 10/2013 | Virgin |
| 2005/0236541 | A1 | 10/2005 | Chang |
| 2007/0264169 | A1 | 11/2007 | Chen |
| 2008/0078793 | A1 | 4/2008 | Brown |
| 2009/0218454 | A1 | 9/2009 | Stanley |
| 2010/0288895 | A1 | 11/2010 | Shamie |
| 2010/0314277 | A1 | 12/2010 | Murray |
| 2012/0126081 | A1 | 5/2012 | Wengreen |
| 2012/0127379 | A1 | 5/2012 | Wengreen |

OTHER PUBLICATIONS

Out of Sight Bracket—Website Part 2 (downloaded on Nov. 13, 2013 from http://www.outofsightbracket.com/OutOfSightBracket/How_to_mount_your_Apple_TV_or_AirPort_Express.html). The website says the Out of Sight Bracket is "Patent Pending." The Out of Sight Bracket might have been made by Gordon H. Beckhart.

Out of Sight Bracket—Website Part 3 (downloaded on Nov. 13, 2013 from http://www.soundandvision.com/content/bracket-keeps-apple-airport-express-and-apple-tv-out-sight).

TV Tray—Website (downloaded on Nov. 13, 2013 from http://h-sq.com/products/tvtray/).

TV Tray—Installation Guide (downloaded on Nov. 13, 2013 from http://www.h-sq.com/downloads/tvtx_ug.pdf).

Cosmos Tray—Website (downloaded on Nov. 13, 2013 from http://www.amazon.com/Cosmos-MD199LL-AirPort-Express-Station/dp/B00C2JNGB2/ref=sr_1_4?ie=UTF8&qid=1384406376&sr=8-4&keywords=apple+tv+mount).

CTA Digital—Website (downloaded on Nov. 13, 2013 from http://www.ctadigital.com/downloads/KIN-WMC-final.pdf).

PDP Mounting Clip—Part 1 (downloaded on Nov. 13, 2013 from http://www.amazon.com/Kinect-Sensor-TV-Mounting-Clip-Xbox/dp/B004XV6ST4).

PDP Mounting Clip—Part 2 (downloaded on Nov. 13, 2013 from http://www.microsoftstore.com/store/msusa/en_US/pdp/Kinect-Sensor-TV-Mounting-Clip/productID.253726200).

PDP Mounting Clip—Part 3 (downloaded on Nov. 13, 2013 from http://www.bestbuy.com/site/pdp-sensor-mounting-clip-for-kinect/3521258.p?id=1218408957863&skuId=3521258).

ScreenDeck (downloaded on Nov. 13, 2013 from http://news.cnet.com/8301-17938_105-20071226-1/screendeck-adds-top-shelf-to-your-flat-panel-tv/).

Center Stage Bracket—Part 1 (downloaded on Nov. 13, 2013 from http://www.bestbuy.com/site/center-stage-bracket-satellite-center-channel-speaker-shelf-bracket-black/5857191.p?id=1218697292805&skuId=5857191).

Center Stage Bracket—Part 2 (downloaded on Nov. 13, 2013 from http://www.bestbuy.com/site/center-stage-bracket-satellite-center-channel-speaker-shelf-bracket-black/5857191.p?id=1218697292805&skuId=5857191).

DreamGear TriMount (downloaded on Nov. 14, 2013 from http://www.dreamgear.net/shop-by-platform/universal/trimount.html).

Medialink router (downloaded on Jan. 2, 2014 from http://www.medialinkproducts.com/docs/MWN-WAPR150N_User_Guide.pdf).

Cisco router wall mounting instructions (downloaded on Jan. 2, 2014 from http://www.cisco.com/en/US/docs/routers/access/1800/1841/hardware/installation/guide/18inst.pdf).

Cisco wall mounting bracket (downloaded on Jan. 2, 2014 from http://www.cisco.com/en/US/docs/routers/access/800/806/hardware/installation/guide/install.pdf).

Netgear ProSafe (downloaded on Jan. 2, 2014 from http://www.storagereview.com/netgear_prosafe_wndap660_dualband_wireless_access_point_review) article includes a date of Dec. 21, 2012.

Wireless router picture (downloaded on Jan. 2, 2014 from http://www.techwarelabs.com/wp-content/gallery/engenius-esr9850-wireless-router/router-bottom.jpg).

Apple TV, downloaded on Feb. 3, 2014 from http://www.apple.com/appletv/what-is/.

Roku media players—Part 1, downloaded on Feb. 3, 2014 from http://www.roku.com/products/roku-2.

Roku media players—Part 2, downloaded on Feb. 3, 2014 from http://www.roku.com/products/compare.

Innovelis, Inc. Product—TotalMount—Apple TV Mounting Kit, downloaded from Amazon.com on Feb. 3, 2014, first available on Amazon.com on Jun. 22, 2011: http://www.amazon.com/TotalMount-Apple-Universal-Mounting-Kit/dp/B0057CVH6W/ref=sr_1_1?ie=UTF8&qid=1391473446&sr=8-1&keywords=TOTALMOUNT.

Innovelis, Inc. Product—TotalMount—Roku Mounting Kit, downloaded from Amazon.com on Feb. 3, 2014, first available on Amazon.com on Jun. 14, 2012: http://www.amazon.com/TotalMount-ROKU-UNIVERSAL-MOUNTING-Compatible/dp/B008B1125W/ref=sr_1_2?ie=UTF8&qid=1391473922&sr=8-2&keywords=totalmount.

Innovelis, Inc. Product—TotalMount—Remote Holder, downloaded from Amazon.com on Feb. 3, 2014, first available on Amazon.com on

(56) References Cited

OTHER PUBLICATIONS

Jul. 2, 2013: http://www.amazon.com/Apple-TV-Remote-Holder-TotalMount/dp/B00DR76YJO/ref=sr_1_3?ie=UTF8&qid=1391474218&sr=8-3&keywords=totalmount.

Innovelis, Inc. Product—TotalMount—AirPort Express Mounting Kit, downloaded from Amazon.com on Feb. 3, 2014, first available on Amazon.com in approximately Sep. 2012: http://www.amazon.com/TotalMount-AirPort- Express-Mounting-Kit/dp/B009HC7BL8/ref=sr_1_4?ie=UTF8&clid=1391474218&sr=8-4&keywords=totalmount.

Innovelis, Inc. Product—TotalMount—Roku Mounting Kit (Version 1), downloaded from Amazon.com on Feb. 3, 2014, first available on Amazon.com on Jan. 19, 2012: http://www.amazon.com/TotalMount-ROKU-MOUNTING- Compatible-Roku/dp/B006ZS4R46/ref=sr_1_5?ie=UTF8&qid=1391474218&sr=8-5&keywords=totalmount.

Innovelis, Inc. Product—TotalMount—AirPort Extreme Mounting Kit, downloaded from Amazon.com on Feb. 3, 2014, first available on Amazon.com in approximately Apr. 2013: http://www.amazon.com/TotalMount-Compatible-generations-compatible-generation/dp/B00CK2CDLK/ref=sr_1_7ie=UTF8&qid=1391474218&sr=8-7&keywords=totalmount.

Innovelis, Inc. Product—TotalMount—Vizio Mounting Kit, downloaded from Amazon.com on Feb. 3, 2014, first available on Amazon.com in approximately May 2013: http://www.amazon.com/TotalMount-VIZIO-Co-Star-Mounting-Kit/dp/B00GDMXSZ8/ref=sr_1_10?ie=UTF8&qid=1391474218&sr=8-10&keywords=totalmount.

Amazon Fire TV, downloaded on Jun. 2, 2014 from http://www.amazon.com/Fire-TV-streaming-media-player/dp/B00CX5P8FC.

Logitech HD Pro Webcam C910, downloaded on Oct. 9, 2014 from http://www.amazon.com/Logitech-Webcam-C910-1080p-Video/dp/B003M2YT96/ref=sr_1_6?ie=UTF8&qid=1287528024&sr=8-6.

HP KQ246AA 8.0 MP Deluxe Webcam, downloaded on Oct. 9, 2014 from http://www.amazon.com/HP-KQ246AA-8-0-Deluxe-Webcam/dp/B001D8AGA2/ref=sr_1_4?ie=UTF8&qid=1410543707&sr=8-4&keywords=hp+webcam.

Logitech Webcam C200, downloaded on Oct. 9, 2014 from http://www.amazon.com/Logitech-960-000415-Webcam-C200/dp/B002GP7ZTQ/ref=pd_cp_pc_0.

USB 6 LED PC Webcam, downloaded on Oct. 9, 2014 from http://www.amazon.com/Webcam-Camera-Night-Vision-Meeting/dp/B00MTGV4F8/ref=sr_1_88?s=electronics&ie=UTF8&qid=1410543946&sr=1-88&keywords=webcam+clamp.

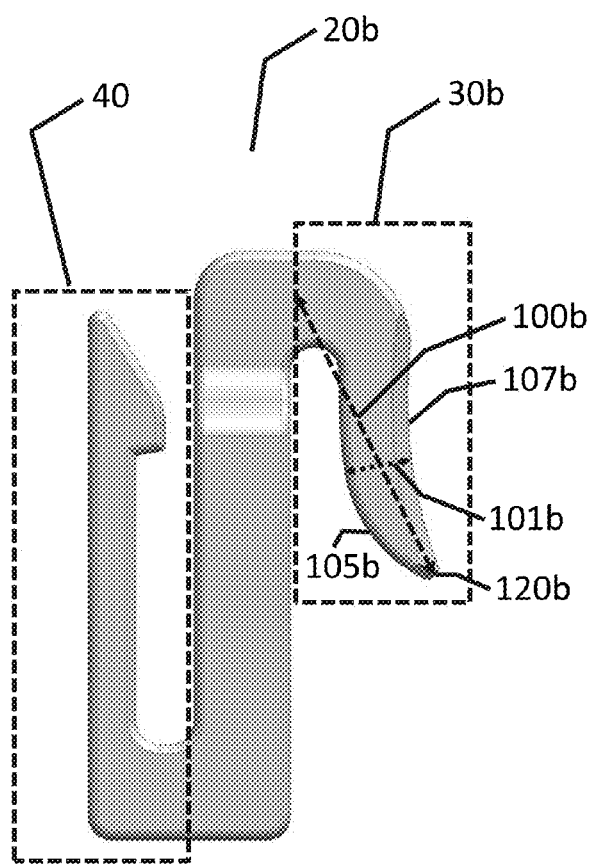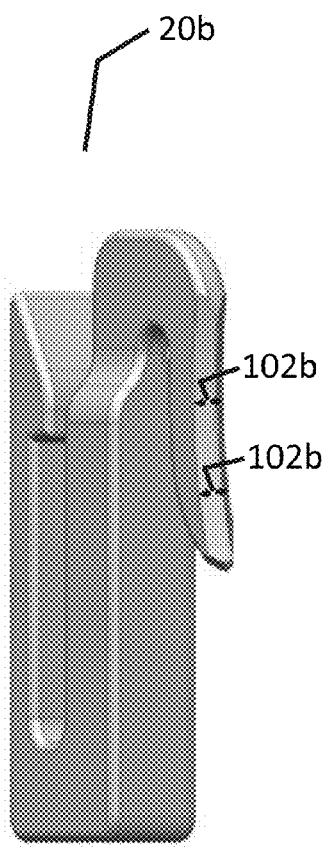
Figure 6a                    Figure 6b

MOUNTING SYSTEMS FOR DIGITAL MEDIA PLAYERS

CROSS-REFERENCE TO RELATED APPLICATIONS

This application claims the benefit as a continuation of U.S. Nonprovisional application Ser. No. 14/209,452, filed on Mar. 13, 2014 and titled Mounting Methods for Digital Media Players, which claims the benefit as a continuation of U.S. Nonprovisional application Ser. No. 14/169,148, filed on Jan. 30, 2014 and titled Mounting Methods for Digital Media Players, which claims the benefit as a continuation of U.S. Nonprovisional application Ser. No. 13/332,373, filed on Dec. 21, 2011 and titled Mounting System for Digital Media Players, which claims the benefit as a continuation-in-part of U.S. Nonprovisional application Ser. No. 13/278,759, filed on Oct. 21, 2011 and titled Mounting System for Digital Media Players, which claims the benefit of U.S. Provisional Application 61/416,736, filed on Nov. 23, 2010 and titled Mounting System for Digital Media Players. The disclosures of application Ser. No. 14/209,452; application Ser. No. 14/169,148; application Ser. No. 13/332,373; application Ser. No. 13/278,759 and Application 61/416,736 are incorporated herein by reference.

TECHNICAL FIELD

The present invention is in the technical field of mounting systems. More specifically, the present invention is in the technical field of mounting systems for digital media players.

BACKGROUND

Users often place digital media players near a television. Television owners desire a convenient means to mount digital media players.

SUMMARY

We have discovered an apparatus and a method that allow users to mount digital media players.

DESCRIPTION OF THE DRAWINGS

FIGS. 6A and 6B illustrate a vertical hook embodiment, which is configured to attach to vertical vents.

DESCRIPTION OF THE PREFERRED EMBODIMENTS

Figure 1:
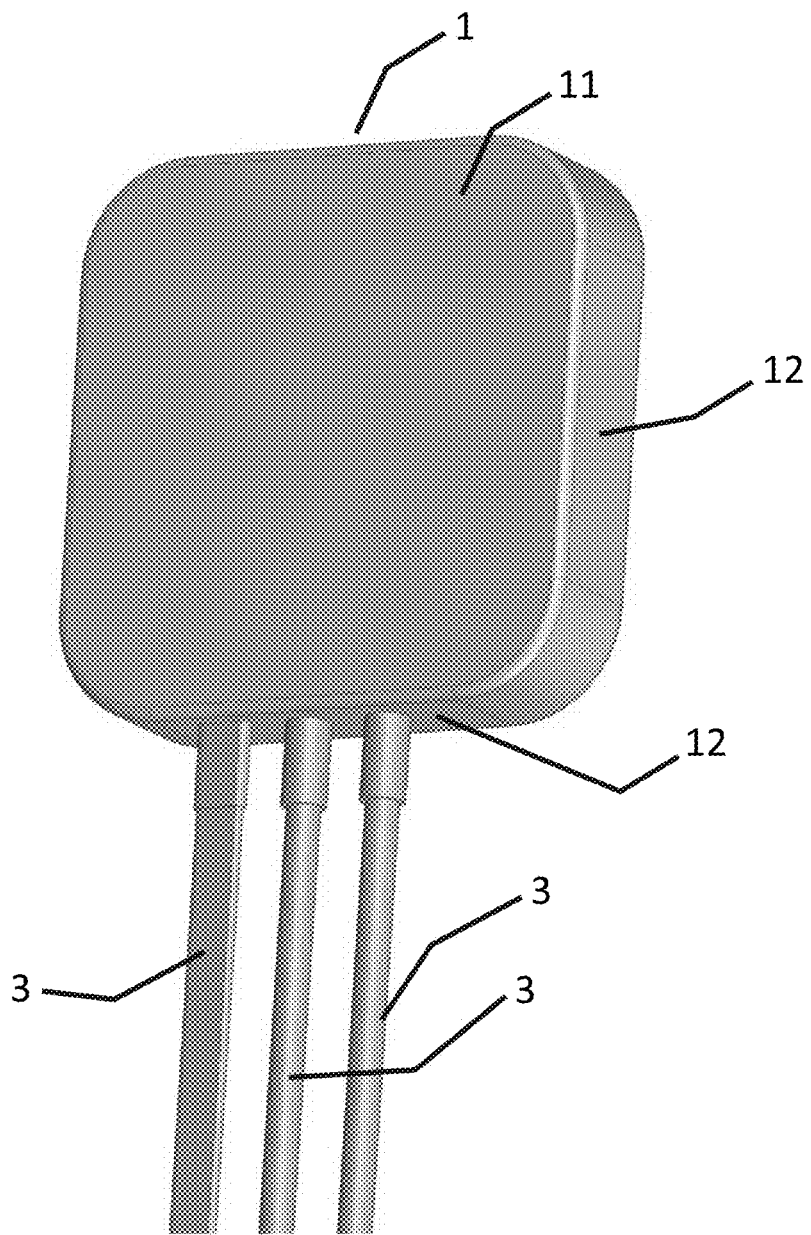
FIG. 1 illustrates a digital media player.

The accompanying drawings form part of the detailed description below. The drawings show specific embodiments in which the invention may be practiced, by way of example or illustration and not by way of limitation. These embodiments are described in enough detail through text and drawing figures to enable those skilled in the art to practice the claimed invention. The embodiments may be combined, other embodiments may be utilized, or structural, logical and mechanical changes may be made without departing from the scope and spirit of the claimed invention. The following description is, therefore, not to be taken in a limiting sense. The description below illustrates implementations of the invention and does not limit the invention.

In the drawings, which are not necessarily drawn to scale, like numerals describe substantially similar components throughout the several views. The drawings illustrate generally, by way of example, but not by way of limitation, various embodiments discussed in this disclosure.

Digital media players include Digital Video Disc (DVD) players, Blu-ray players, and digital media extenders such as Apple TVs. Digital media players often transmit digital signals wirelessly or through a wire such as a High-Definition Multimedia Interface (HDMI) cable to a screen that displays an image based on the digital signal. Screens include computer monitors, televisions, and image-producing portions of movie projectors. Televisions include flat-panel displays, flat-screen televisions, and tube televisions.

Owners of digital media players often prefer to mount their digital media player near their screens. For example, a person who owns a flat screen television that is mounted on the wall might want to mount her Apple TV onto her flat screen television or onto the wall behind her flat screen television.

Figure 2:
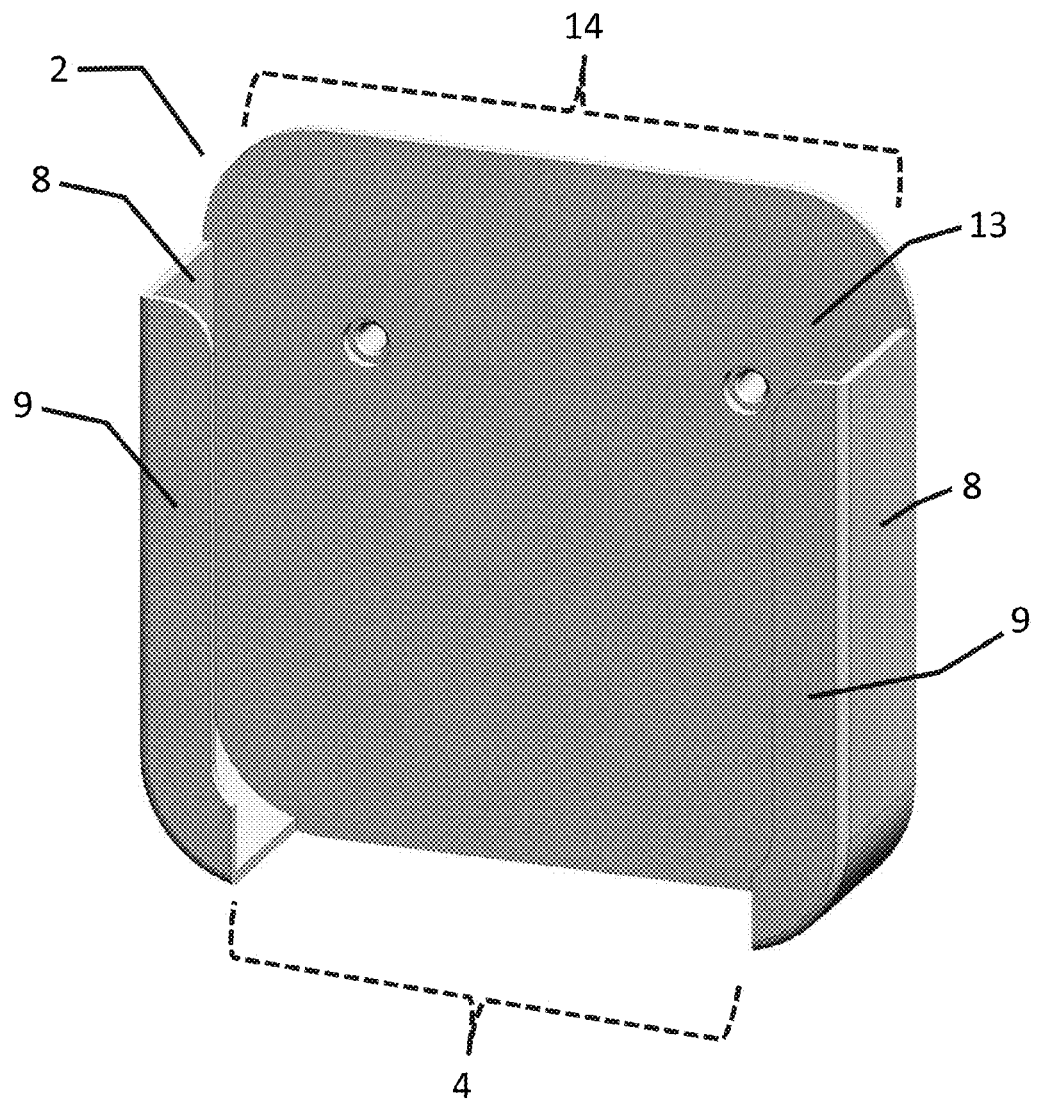
FIG. 2 illustrates one embodiment of the present invention.
Figure 3:
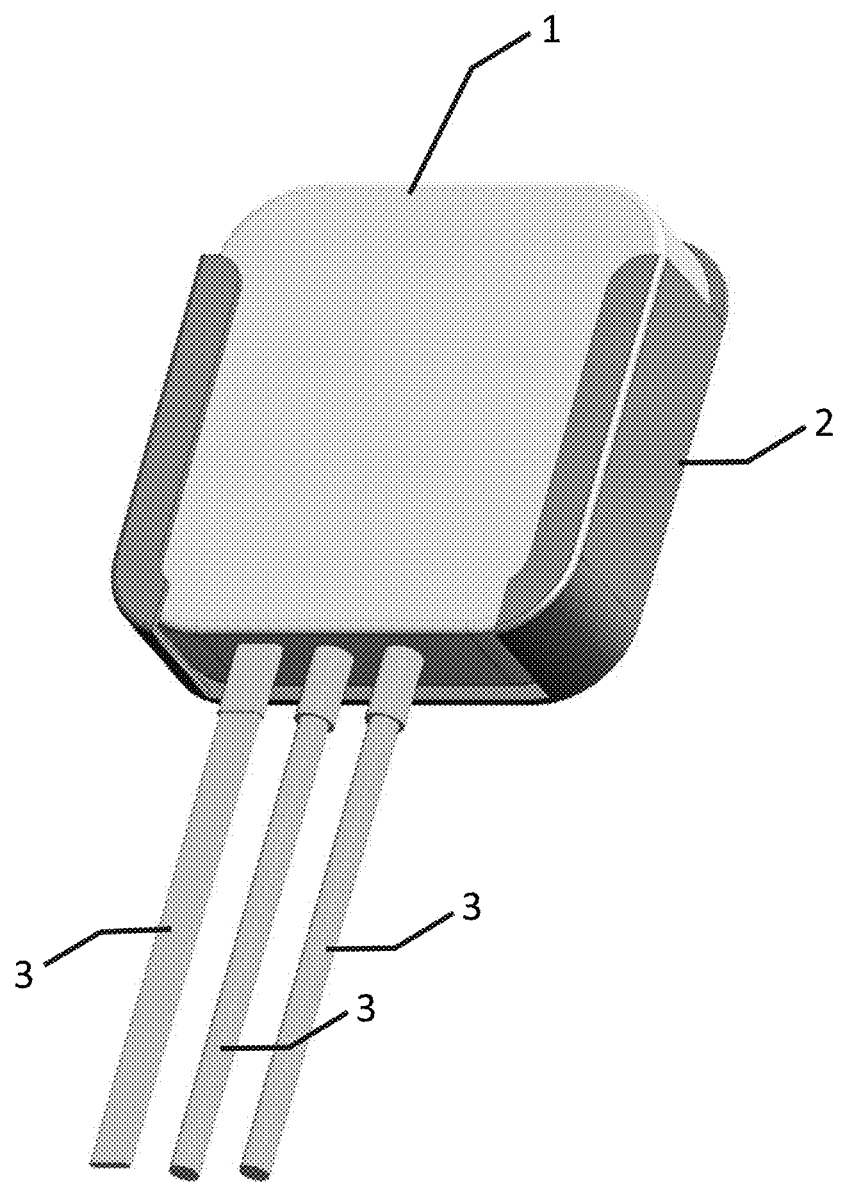
FIG. 3 illustrates a digital media player inside a tray embodiment.

FIG. 1 illustrates a digital media player 1. FIG. 2 shows one embodiment of the present invention. The digital media player 1 slides into a tray 2. FIG. 3 shows the digital media player 1 inside the tray 2.

In one embodiment, the tray 2 is configured such that a user can connect electrical cables 3 to the digital media player 1 and then slide the digital media player 1 into the tray 2 without having to disconnect the electrical cables 3. For example, the tray 3 in FIG. 2 includes an open portion 4 that enables the user to slide the digital media player 1 with attached electrical cables 3 into the tray 2. In one embodiment, the tray 2 does not have sidewalls 8 nor does the tray 2 have retaining lips 9 in the open portion 4. The open portion 4 is located such that the electrical cables 3 exit the digital media player 1 in the open portion 4.

The digital media player has two large sides 11 and four small sides 12. In one embodiment, the tray has two retaining lips 9 that engage the large side 11 that faces away from the tray base 13. In this embodiment, the two retaining lips 9 are separated by the open portion 4. In another embodiment, the tray 2 includes an open top 14 to allows the digital media player 1 to slide into the tray 2. The open top 14 is located on the opposite side of the tray relative to the open portion 4.

Figure 4:
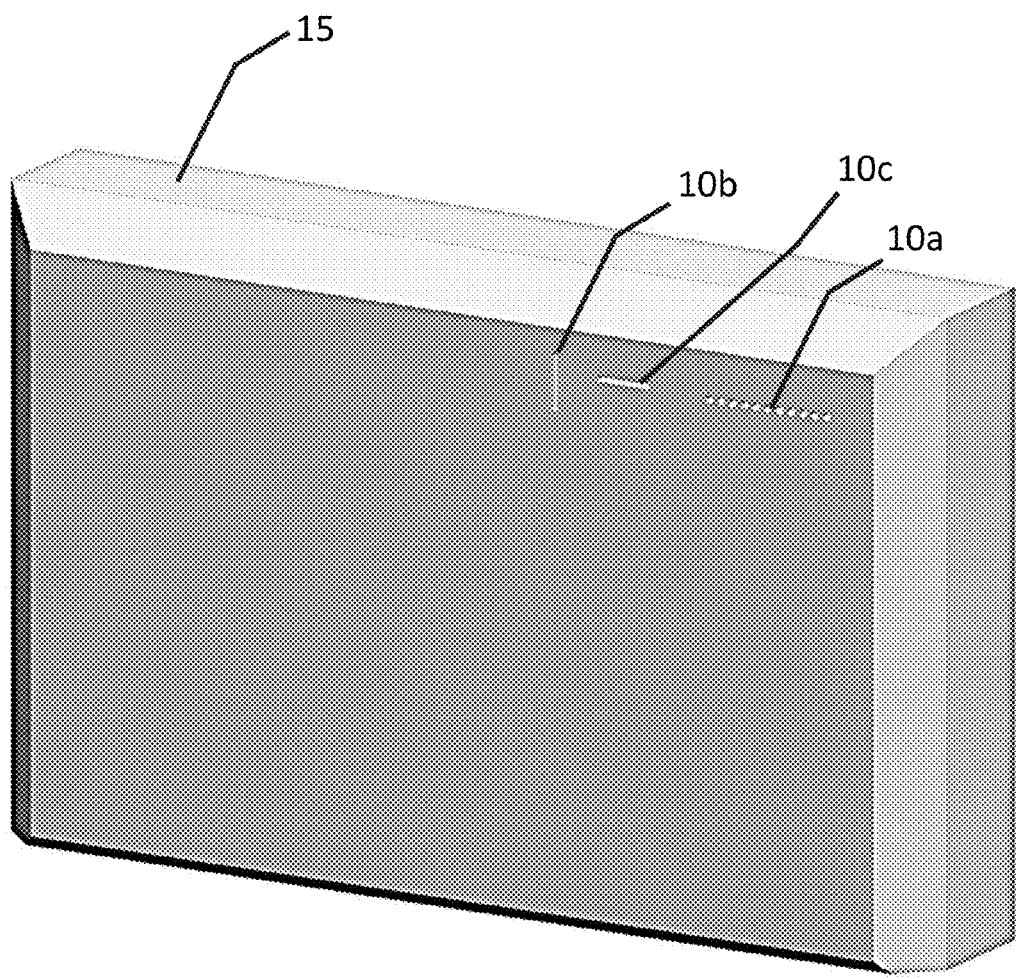
FIG. 4 illustrates round vents, vertical vents, and horizontal vents.

The tray 2 can attach to vents 10 in a screen 15. This mounting method is advantageous because it can be achieved without tools. FIG. 4 shows round vents 10a, vertical vents 10b, and horizontal vents 10c. A round vent 10a has an approximately round opening. A vertical vent 10b has an opening that is longer vertically than the opening is horizontally. For example, a vertical vent opening may measure 3 mm vertically and 1 mm horizontally (when the screen is placed in its normal movie-viewing orientation). A horizontal vent 10c has an opening that is longer horizontally than the opening is vertically. For example, a horizontal vent opening may measure 3 mm horizontally and 1 mm vertically. Screen manufacturers often include vents 10 in the back of the screen 15 to allow heat to escape from inside the screen 15.

In one embodiment, a mounting system includes three types of hooks. The first type of hook is configured for round vents 10a. The second type of hook is configured for vertical vents 10b. The third type of hook is configured for horizontal vents 10c. This embodiment enables the mounting system to be compatible with screens that have round vents 10a, vertical vents 10b, and horizontal vents 10c because the user can select the hook type that is compatible with the user's screen. In other embodiments, the mounting system only contains two hook types or even just contains one hook type.

Hooks 20 attach the tray 2 to the vents 10. In some embodiments, the hooks are part of the tray. For example, the hooks may be formed as part of the molding process that forms the tray. In other embodiments, the hooks are permanently attached to the tray. In other embodiments, the hooks are detachably coupled to the tray such that the hooks may be removed from the tray after the hooks are attached to the tray.

Figures 5A, 5B:
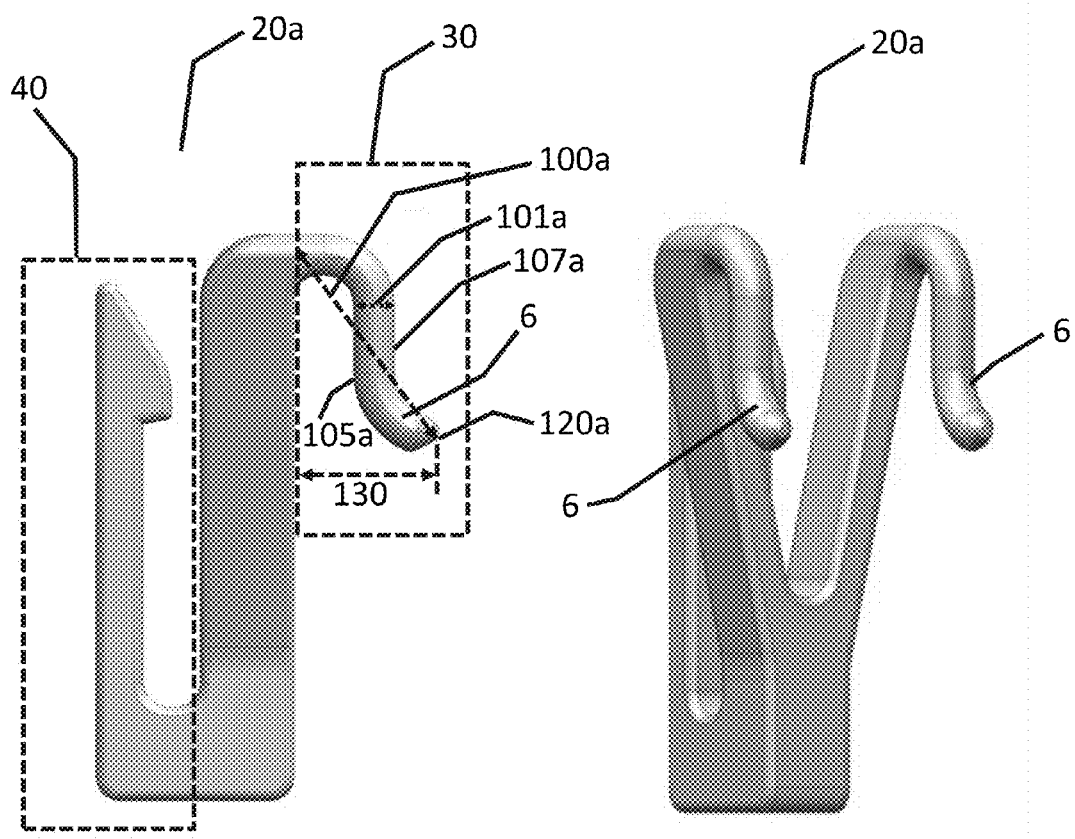
FIGS. 5A and 5B illustrate a circular hook embodiment, which is configured to attach to round vents.

FIGS. 5a and 5b show a circular hook 20a, which is configured to attach to round vents 10a. In one embodiment, the circular hook 20a has more than one protrusion 6 that enters vents 10. The circular hook 20a has a front portion 30a with a substantially round cross section. The front portion 30 enters into the round vent 10a.

The front portion 30 of a hook 20 is configured to enter a vent 10. In some embodiments, the entire hook is the front portion because the entire hook is sized and shaped to enter the screen's vent. In other embodiments, only part of the hook is the front portion because part of the hook is designed to enter the vent while other parts of the hook serve other purposes such as coupling the front portion to the tray 2.

Figures 7A, 7B:
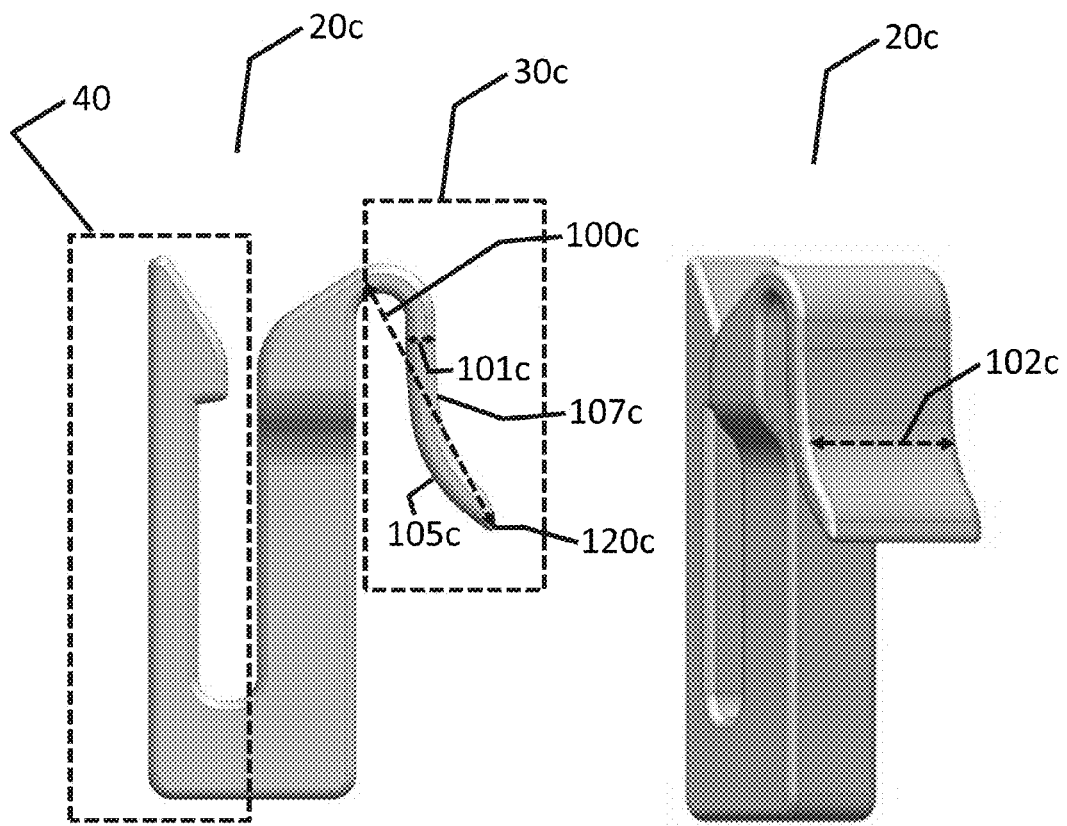
FIGS. 7A and 7B illustrate a horizontal hook embodiment, which is configured to attach to horizontal vents.

FIGS. 6a and 6b show a vertical hook 20b with a front portion 30b, which is configured to attach to vertical vents 10b. FIGS. 7a and 7b show a horizontal hook 20c with a front portion 30c, which is configured to attach to horizontal vents 10c.

The front portion 30 has a length 100, a thickness 101, and a width 102. The length 100 is defined as the distance from middle of where the front portion attaches to the rest of the hook to the front portion's most distant point from the middle of where the front portion attaches to the rest of the hook. FIG. 5a shows an example length 100a. FIG. 5a also shows the back profile 105a and the front profile 107a. The back profile 105 is the closest profile on the front portion 30 to the back portion 40 of the hook 20. The front profile 107 is the most distant profile on the front portion 30 to the back portion 40 of the hook 20. The front portion's thickness 101 is the average linear distance between the back profile 105 and the front profile 107. The width 102 of the front portion 30 is perpendicular to the thickness 101. For example, FIG. 7b shows the width 102c of the horizontal hook 20c. The width 102 is determined by finding the average width of the front portion 30.

In one embodiment, a hook 20 has a thickness 101 that is at least 50% larger than the hook's width 102. For example, FIGS. 6a and 6b show a hook 20b with a thickness 101b that is greater than the hook's width 102b. In another embodiment, a hook 20 has a thickness 101 that is at least twice as large as the hook's width 102. In yet another embodiment, a hook 20 has a thickness 101 that is at least three times as large as the hook's width 102. In various embodiments, the hooks have a thickness that is less than 2 mm, 3 mm, or 4 mm.

In one embodiment, a hook 20 has a width 102 that is at least 50% larger than the hook's thickness 101. For example, FIGS. 7a and 7b show a hook 20c with a width 102c that is greater than the hook's thickness 101c. In another embodiment, a hook 20 has a width 102 that is at least twice as large as the hook's thickness 101. In yet another embodiment, a hook 20 has a width 102 that is at least three times as large as the hook's thickness 101.

In one embodiment, two circular hooks 20a are coupled to the tray 2. In another embodiment, at least three circular hooks 20a are coupled to the tray 2. In yet another embodiment, at least four circular hooks 20a are coupled to the tray 2. In yet another embodiment, at least four hooks 20 are coupled to the tray 2. In yet another embodiment, at least ten hooks 20 are coupled to the tray 2.

Figure 10:
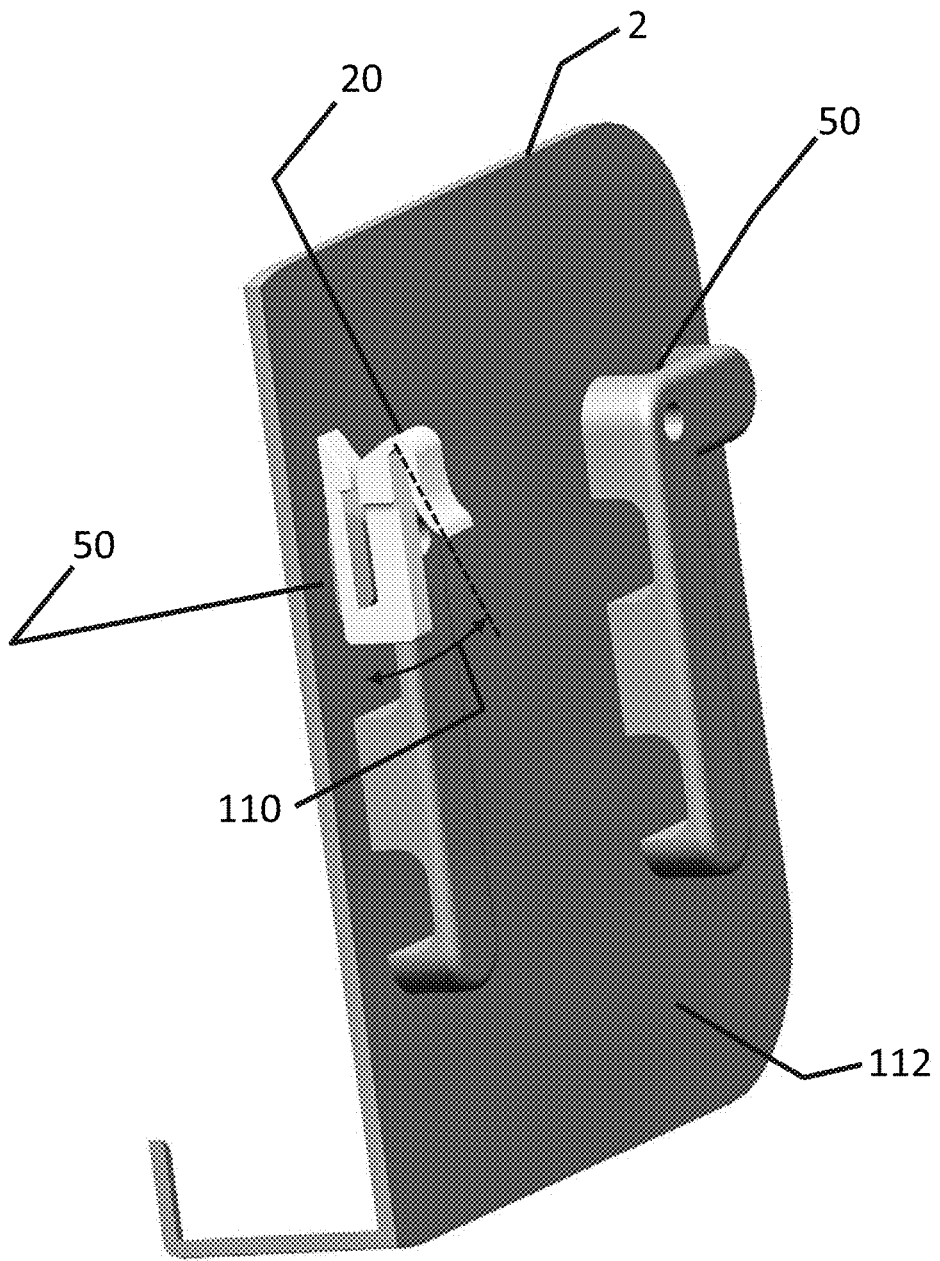
FIG. 10 illustrates cross section A-A from FIG. 9.

In various embodiments, the hook 20 includes an approach angle 110 that helps the hook 20 hold itself to the vent 10. The approach angle 110 is defined as the angle between the hook's length 100 and the back of the tray 112 as illustrated in FIG. 10. In various embodiments, the approach angle 110 is less than 60 degrees, less than 50 degrees, less than 40 degrees, less than 30 degrees, or less than 20 degrees.

Figure 11:
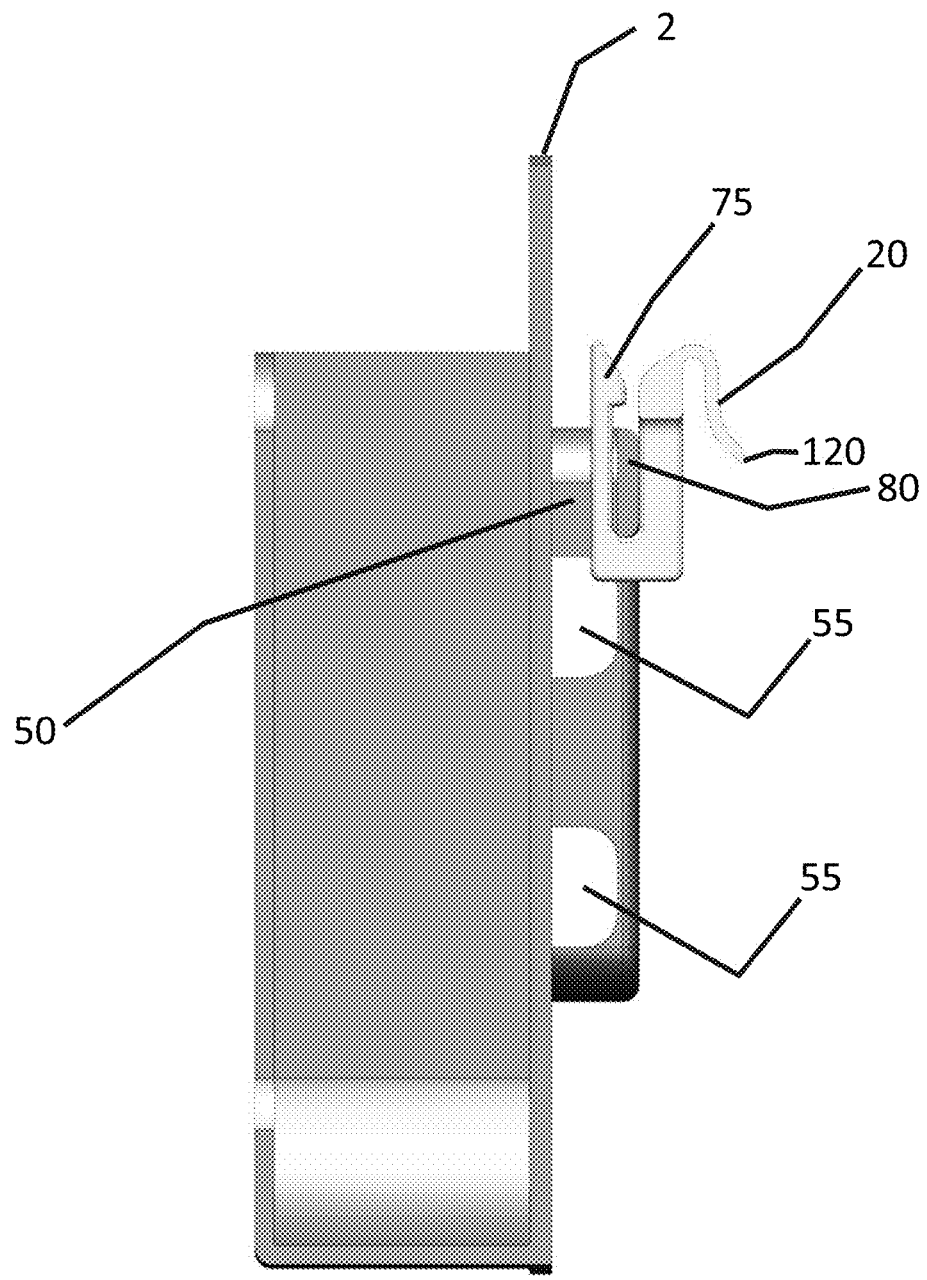
FIG. 11 illustrates a side view of cross section A-A from FIG. 9.

In various embodiments, the distal end of the hook 20 includes a forwardly curved portion 120. The distal end is the end of the hook 20 that is configured to enter the vent 10 before other portions of the hook 20 enter the vent 10. The forwardly curved portion 120 helps the hook 20 enter the vent's opening. FIG. 11 shows that the forwardly curved portion 120 causes the distal end to be positioned farther away from the tray 2 than the distal end would be positioned without the forwardly curved portion 120. The forwardly curved portion 120 curves the front portion 30 away from the tray 2 when the hook 20 is coupled to the tray 2. In various embodiments, the forwardly curved portion 120 curves at least 10 degrees, at least 20 degrees, at least 30 degrees, or at least 40 degrees from the portion of the hook to which the forwardly curved portion 120 is attached.

A hook's extension distance 130 is the distance from the attachment plane defined by where the front portion 30 attaches to the rest of the hook 20 to the front portion's most distant point as shown in FIG. 5a. For the purpose of measuring the extension distance 130, the attachment plane should be parallel to the back of the tray 112. In various embodiments, the extension distance 130 is less than 8 mm, less than 10 mm, or less than 12 mm.

In various embodiments, the front portion 30 is flexible. A front portion 30 is herein defined as flexible if the distal end can move at least 3 mm to either side for every 10 mm of length without moving any portion of the hook besides the front portion or causing more than 1 mm of permanent deformation when tested at 74 degrees Fahrenheit and held in the side position for one to two seconds. Moving to the side is defined as moving into or out of the page in FIGS. 5*a*, 6*a*, and 7*a*.

In one embodiment, the hooks 20 are metal. In another embodiment, the hooks 20 are a non-electrically conductive material such as plastic or rubber. In one embodiment, the front portion 30 is metal covered with a nonconductive layer such as rubber, plastic, or any other nonconductive substance. The front portion 30 may have a circular cross section. In various embodiments, metal wires or rods protrude from the back of the tray 112 with an approach angle of less than 60 degrees, less than 50 degrees, less than 40 degrees, less than 30 degrees, or less than 20 degrees. FIG. 5*a* shows an embodiment wherein the front portion 30 comprises metal covered by a nonconductive layer. In various embodiments, at least two front portions 30 that each comprise at least one metal wire are attached to the tray, at least three front portions 30 that each comprise at least one metal wire are attached to the tray, at least four front portions 30 that each comprise at least one metal wire are attached to the tray, or at least five front portions 30 that each comprise at least one metal wire are attached to the tray.

Figure 8:
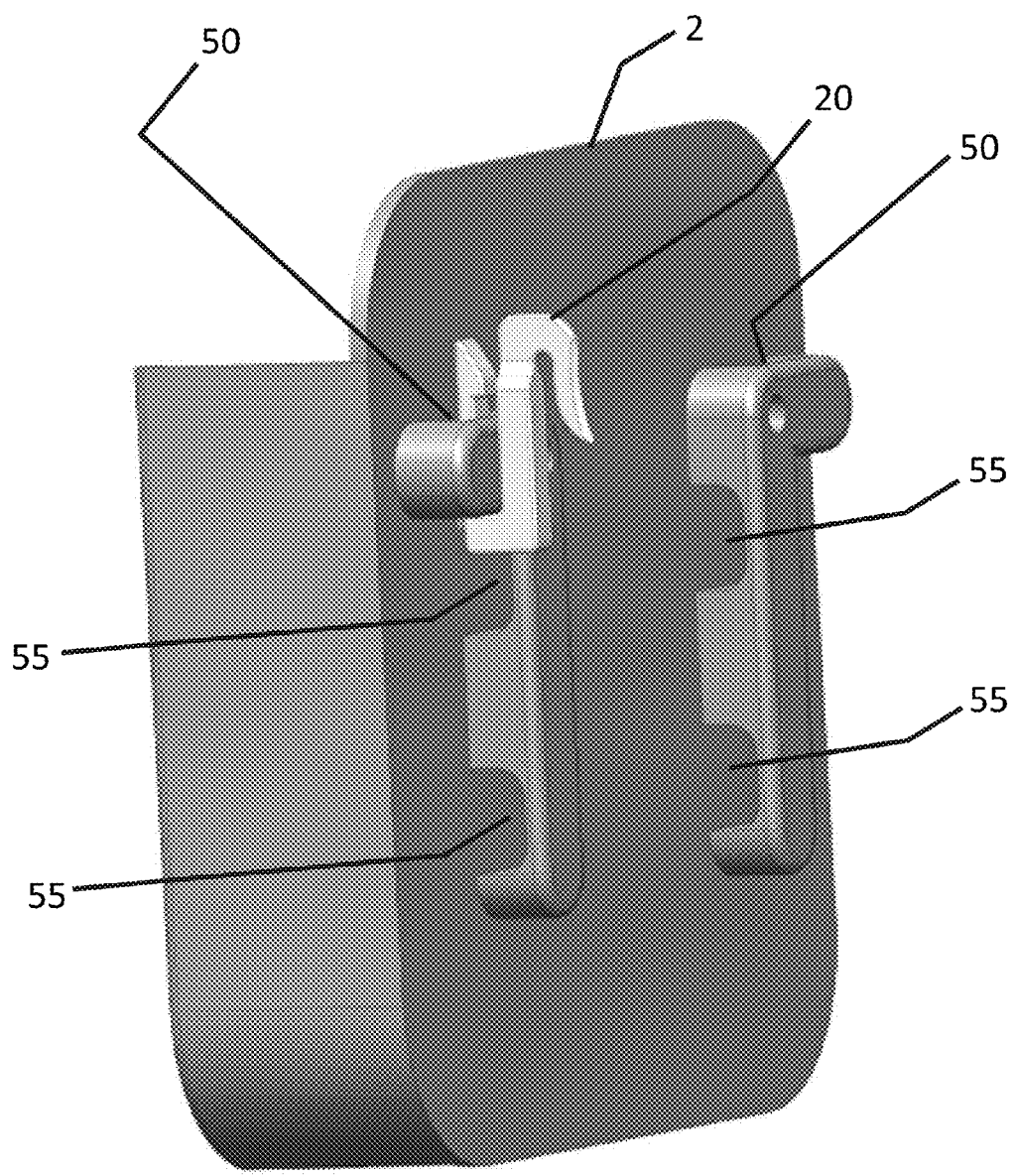
FIG. 8 illustrates an embodiment where a back portion slides into a first opening in the tray.

The hooks 20 have a back portion 40, which is configured to attach to the tray 2. FIG. 8 shows an embodiment where the back portion 40 slides into a first opening 50 in the tray 2. In various embodiments, the first opening 50 is at least 2 mm, 3 mm, 4 mm, or 5 mm wider than the back portion 40 that slides into the first opening 50 to enable the hook to slide back and forth in the first opening such that the hook 20 is able to move to align itself with the vent 10. FIG. 10 shows cross section A-A from FIG. 9 of the hook 20 in the first opening 50. FIG. 11 illustrates a side view of cross section A-A from FIG. 9 of the hook 20 in the first opening 50.

In one embodiment, the following method is used to attach the tray 2 to the screen 15. The user determines which style of hook 20 is compatible with the vents 10 on her screen 15. The user attaches the hooks 20 to the tray 2. The user attaches the hooks 20 to the vents 10. The user attaches the digital media player 1 to the tray 2. The above steps can be performed in orders different from the order listed above. For example, the user can attach the hooks 20 to the vents 10 before attaching the hooks 20 to the tray 2. In another method, the user attaches the tray 2 to the vents 10 by using hooks 20.

Figure 16:
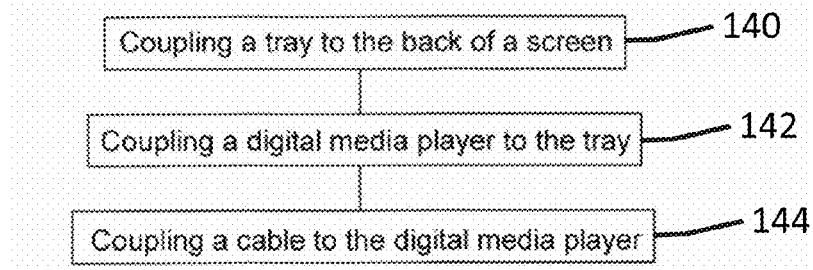
FIG. 16 illustrates a method embodiment of the present invention with various optional steps, the order of which may be changed.
Figure 17:
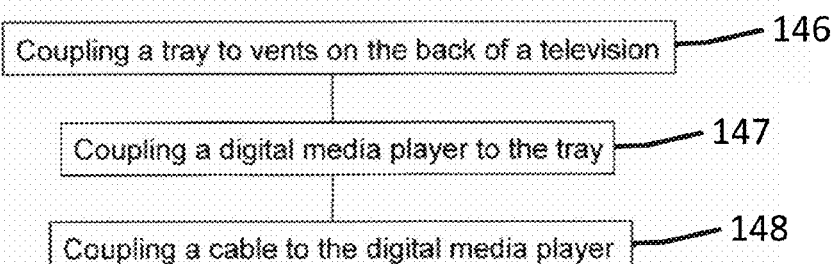
FIG. 17 illustrates a method embodiment of the present invention with various optional steps, the order of which may be changed.
Figure 18:
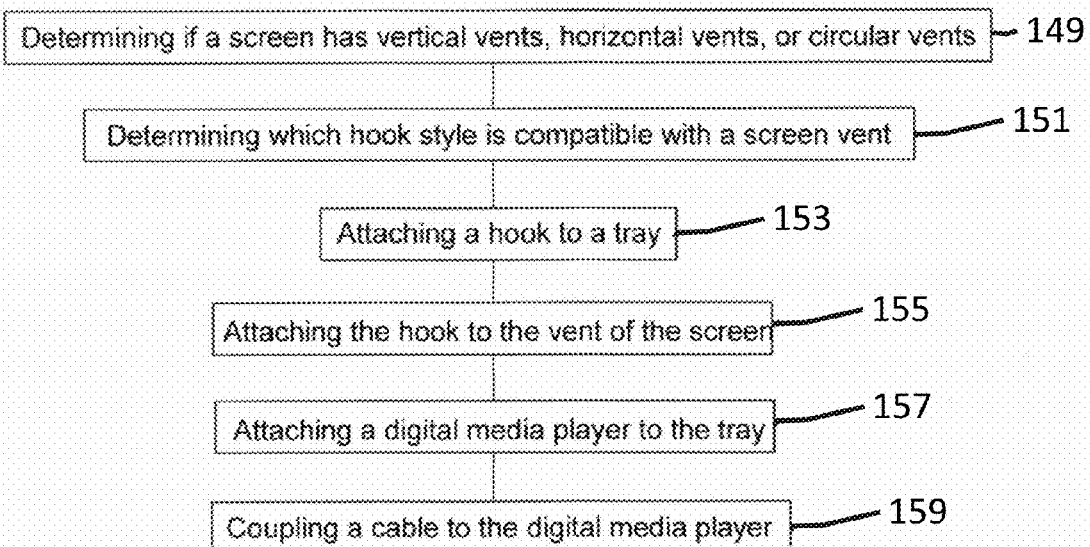
FIG. 18 illustrates a method embodiment of the present invention with various optional steps, the order of which may be changed.

FIGS. 16-18 illustrate various method embodiments of the present invention. The steps in these methods are optional and may be performed in any order. The steps of the various methods may be combined with each other.

In one embodiment, the tray includes additional openings 55 as illustrated in FIGS. 8 and 11. In one embodiment, the following method is used to mount the tray 2: The user ties the tray 2 to the screen mount 60 using a fastening loop 65.

Figure 12:
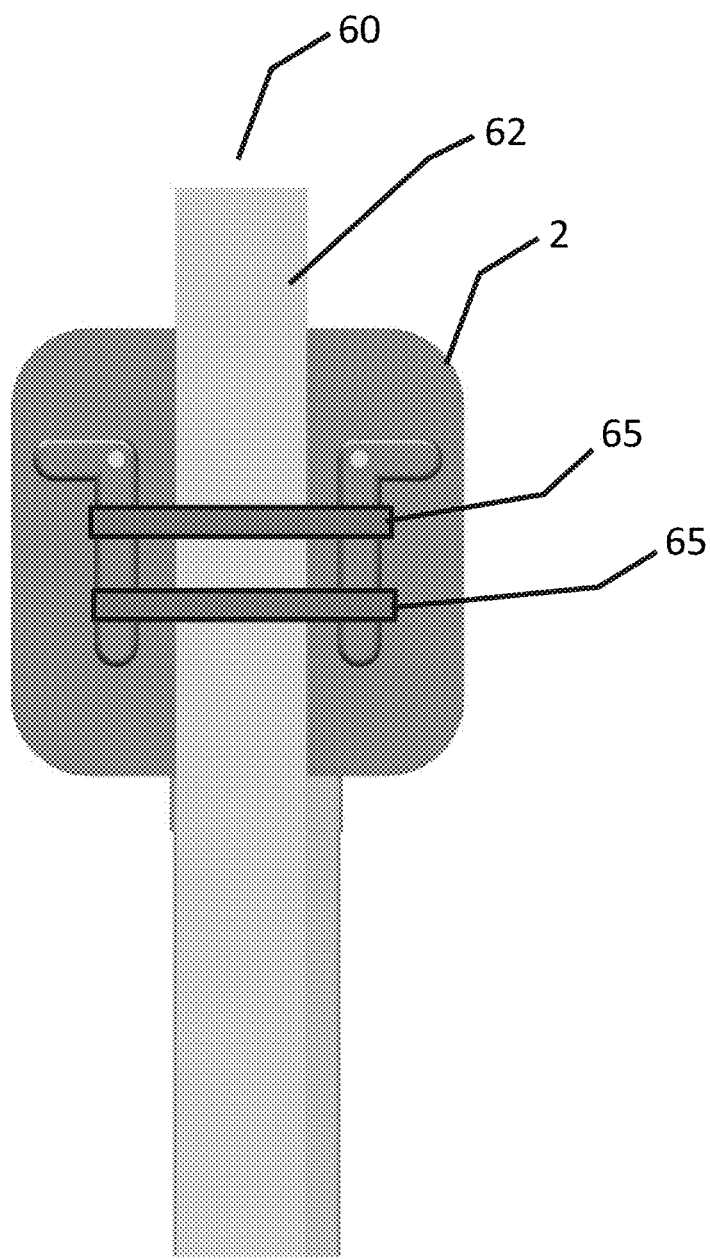
FIG. 12 illustrates an embodiment with fastening loops securing a tray.

Fastening loops 65 include cable ties, zip ties, ropes, strings, and bands such as Velcro bands. Screen mounts 60 attach screens 15 to walls such as the vertical walls that form the outer perimeter of rooms in a building such as a home or office. Screen mounts 60 often include vertical bars 62 and horizontal bars. In one embodiment, the user ties the tray 2 to the vertical bar 62. In another embodiment, the user ties the tray 2 to the horizontal bar. The user ties the tray 2 to the bar 62 by placing a fastening loop 65 around the bar 62 and through the opening 50, 55. FIG. 12 shows fastening loops 65 securing the tray 2 to the vertical bar 62 by going around the vertical bar 62 and through the additional openings 55.

Figure 9:
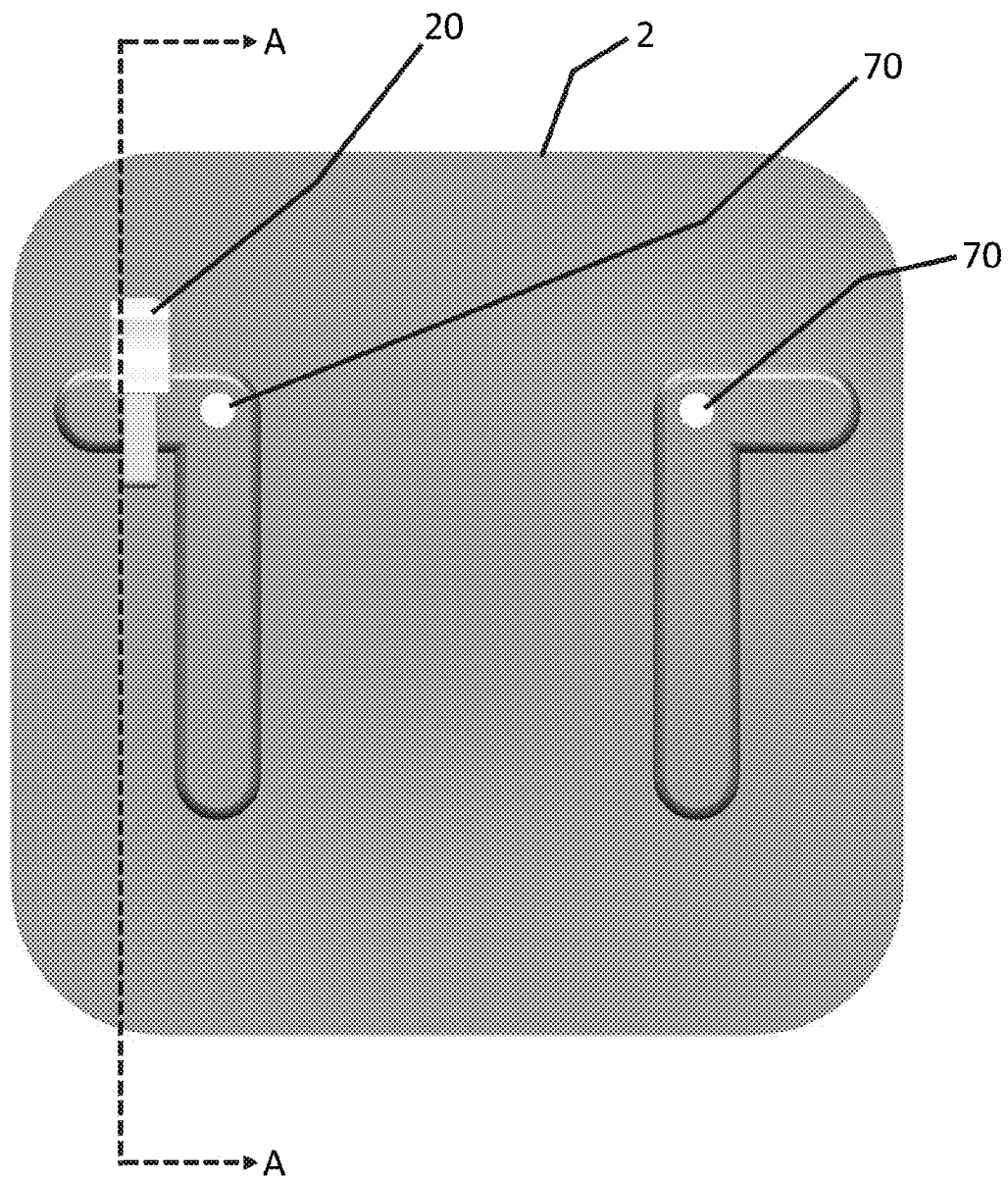
FIG. 9 illustrates an embodiment with a hook in a first opening.

In another embodiment, the tray 2 also includes screw holes 70 as shown in FIG. 9. In another mounting method, the user places a screw through the screw hole 70, presses the tray 2 against a wall, and then rotates the screw such that the screw advances into the wall to secure the tray 2 to the wall. In another embodiment, the user places a nail through the screw hole 70, presses the tray 2 against a wall, and then pushes the nail's head such that the nail advances into the wall to secure the tray 2 to the wall.

In another embodiment, the tray 2 includes first openings 50, additional openings 55, and screw holes 70 such that the user can mount the tray 2 by attaching the tray 2 to the vents 10 by using hooks 20, can mount the tray 2 by attaching the tray 2 to the bars 62 by using fastening loops 65, or can mount the tray 2 by attaching the tray 2 to the wall by using screws or nails. In a related embodiment, a package in which the tray 2 is sold to customers includes hooks 20, fastening loops 65, and nails. In a related embodiment, the package in which the tray is sold to customers includes hooks 20, fastening loops 65, and screws. Thus, the package is a universal mounting system because it provides means for an extremely wide range of customers to mount their digital media players.

In one embodiment, the hooks 20 attach to the tray 2 via a snap fit. A snap fit is a self-locking joint in which one part flexes until it slips past a second part. Once the part that flexes slips past the second part, the part that flexes returns to substantially its initial shape, which prevents the two parts from inadvertently separating. FIG. 11 shows an embodiment where a flexing part 75 has moved past a second part 80. In the embodiment shown in FIG. 11, the second part 80 forms the outer perimeter of the first opening 50. The snap fit is advantageous because it prevents the hook 20 from inadvertently falling off the tray 2.

Figure 13:
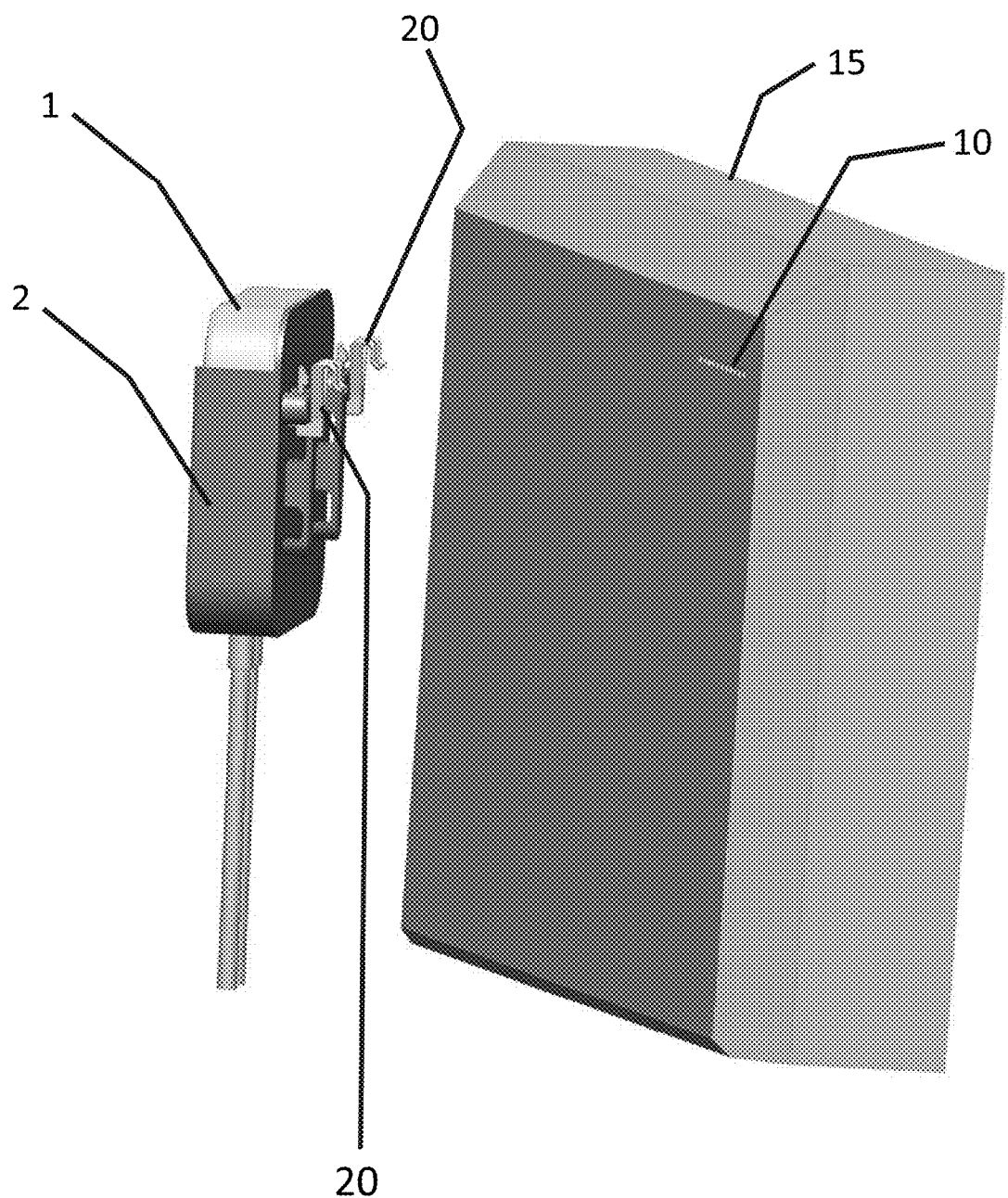
FIG. 13 illustrates hooks attached to a tray as the tray approaches vents.
Figure 14:
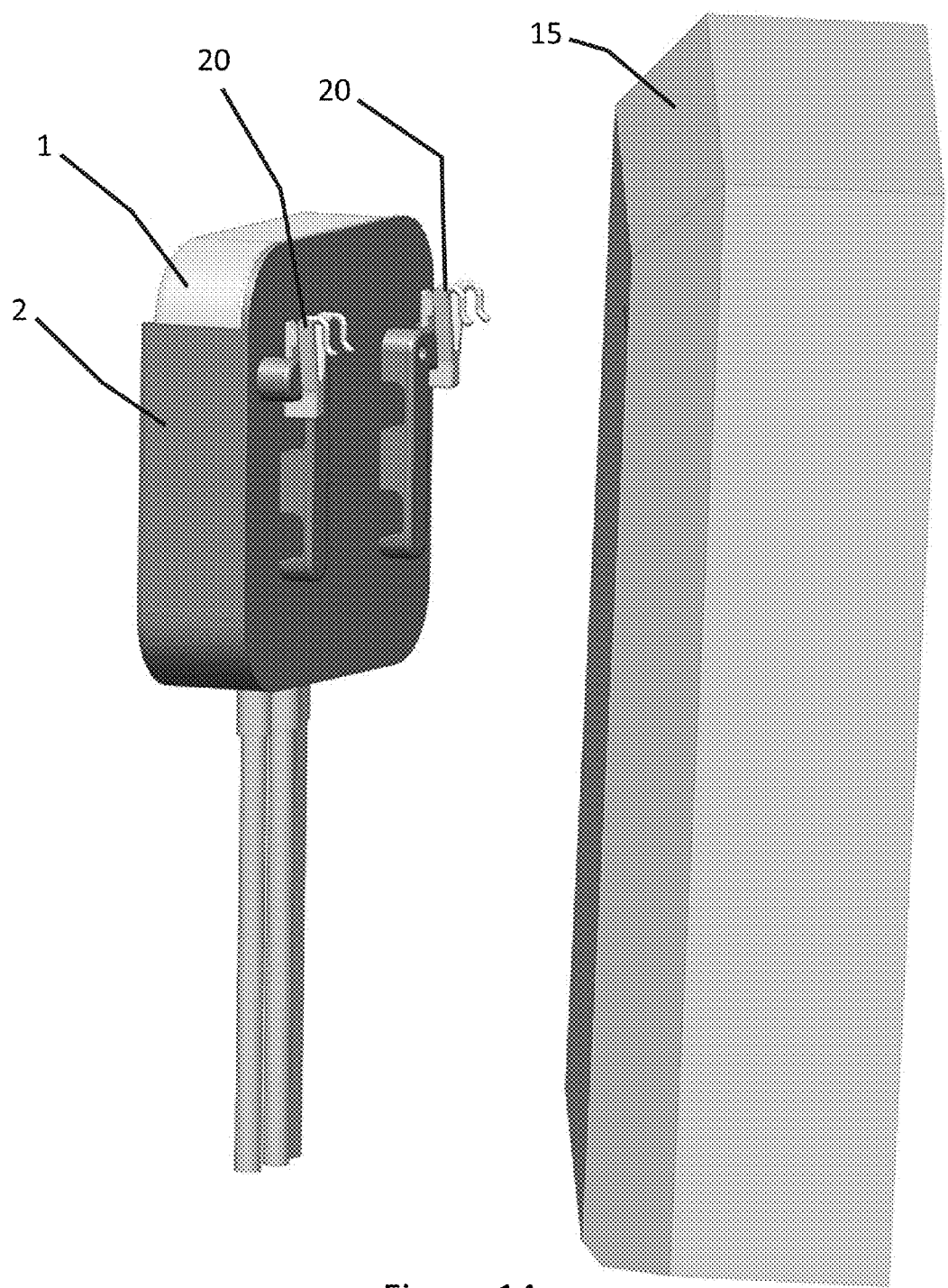
FIG. 14 also illustrates hooks attached to a tray as the tray approaches vents.
Figure 15:
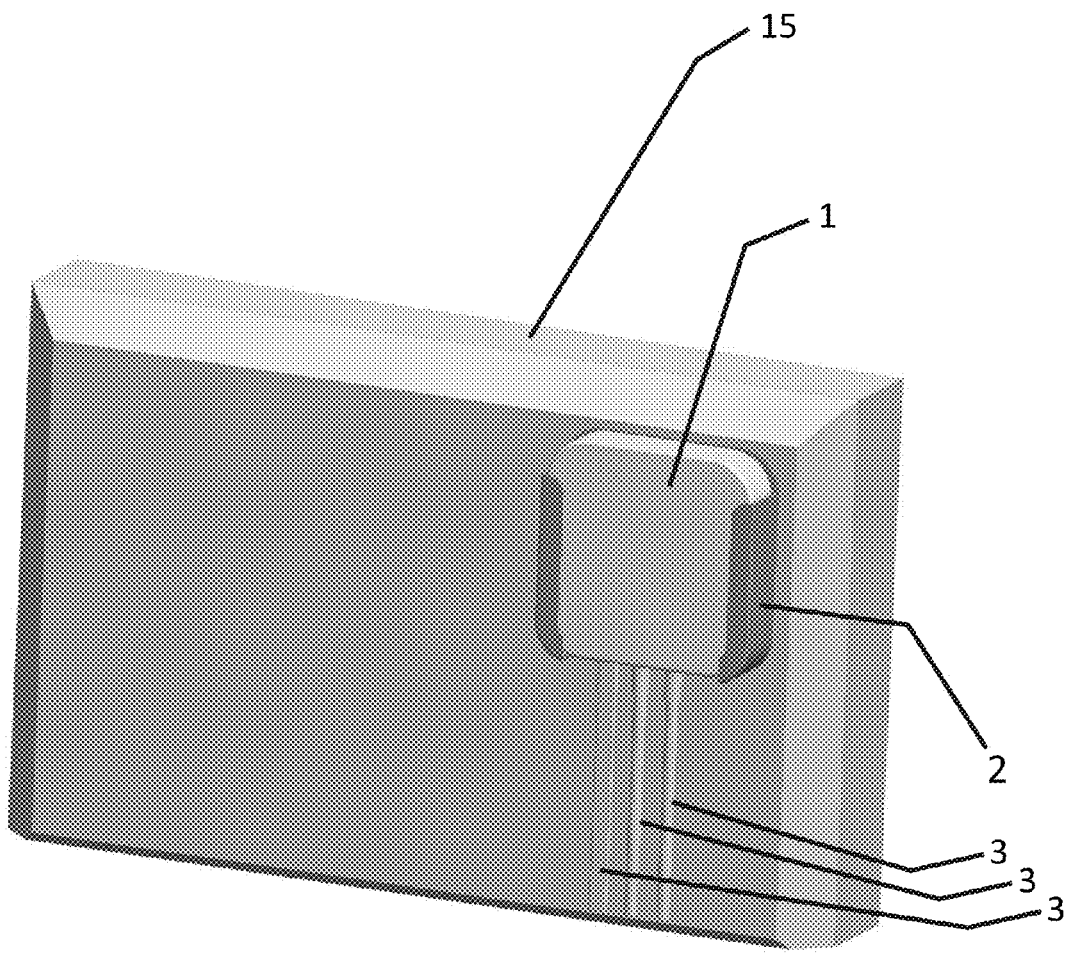
FIG. 15 illustrates a tray embodiment mounted on a screen by using hooks.

FIGS. 13 and 14 show hooks 20 attached to the tray 2 as the tray 2 approaches the vents 10. FIG. 15 shows the tray 2 mounted on the screen 15 by using the hooks 20.

Many other tray geometries are possible. For example, the tray may completely or partially enclose the digital media player. In an embodiment, the tray encloses all sides of the digital media player. In an embodiment, the retaining lips 9 shown in FIG. 2 extend towards each other such that they touch each other and/or join together to enable the tray to engage a larger portion of the large side 11 that faces away from the tray base 13. In one embodiment, the tray includes side walls 8 that convert open portion 4 and/or open top 14 into at least partially closed portions. Various tray embodiments include walls that engage or cover at least a portion of any combination of the digital media player's large sides 11 and small sides 12. In another embodiment, the tray 2 includes at least three screw holes 70.

The tray 2 can be molded from acrylonitrile butadiene styrene (ABS) plastic with a hardness of 55 shore D, 65 shore D, 75 shore D, 85 shore D, or 95 shore D. The hooks 20 can be molded from the same ABS plastic materials that can be used for the tray. The hooks 20 can also be molded from polyurethane with a hardness of 70 shore A, 80 shore A, 90 shore A, or 95 shore A. The hooks 20 can also be molded from silicone rubber with a hardness of 85 shore A or 95 shore A. The screws can be a metal such as stainless steel and can be fabricated through standard screw machining processes.

The above description is intended to be illustrative, and not restrictive. For example, the above embodiments and aspects thereof may be used in combination with each other. Many other embodiments will be apparent to those skilled in the art after reading the above description. While the foregoing written description of the invention enables one of ordinary skill to make and use the claimed invention, those of ordinary skill will understand and appreciate the existence of variations, permutations, combinations, equivalent means, and equivalents of the specific embodiments, methods, and examples herein. The invention should therefore not be limited by the above described embodiments, methods, and examples, but by all embodiments and methods within the scope and spirit of the invention as claimed.

We claim:

1. A mounting system configured to mount a digital media player to a television having a first vent and a second vent, wherein the television is configurable to display images based on digital signals from the digital media player, the mounting system comprising:
   a base coupled to the television, wherein the base is located at least partially between the digital media player and the television;
   a first sidewall coupled to the base;
   a second sidewall coupled to the base, wherein the first sidewall and the second sidewall are configured to couple the digital media player to the base, the first sidewall and the second sidewall are oriented such that they protrude away from the television, and at least a portion of the digital media player is located between the first sidewall and the second sidewall;
   a first hook coupled to the base, wherein the first hook comprises a first front portion that protrudes away from the base and towards the television, and wherein the first front portion enters the first vent of the television such that the first hook couples the base to the television; and
   a second hook coupled to the base, wherein the second hook comprises a second front portion that protrudes away from the base and towards the television, and wherein the second front portion enters the second vent of the television such that the second hook couples the base to the television.

2. The mounting system of claim 1, wherein the first hook is located at least partially between the digital media player and the television, and wherein the first front portion of the first hook comprises an approach angle of less than 40 degrees.

3. The mounting system of claim 1, wherein the first front portion of the first hook comprises an end having a forwardly curved portion configured to enter the first vent of the television.

4. The mounting system of claim 1, wherein the first sidewall and the second sidewall are coupled at opposite ends of the base, and
   an open portion is located between the first sidewall and the second sidewall in a region adjacent to the base, wherein an electrical cable is connected to the digital media player, and wherein the digital media player is coupled to the mounting system such that the electrical cable exits the digital media player through the open portion while the first hook couples the base to the television.

5. The mounting system of claim 1, wherein the first sidewall and the second sidewall are coupled at opposite ends of the base, and
   wherein the base comprises a first opening and the first hook comprises a back portion configured to couple to the base, wherein the back portion of the first hook is coupled to a perimeter of the first opening of the base while the first front portion is located at least partially inside of the first vent, and wherein the first opening is wider than the back portion.

6. The mounting system of claim 1, wherein the first hook comprises a back portion coupled to the base,
   the first front portion of the first hook comprises a first protrusion and a second protrusion that protrude away from the base and towards the television, wherein the first protrusion and the second protrusion are configured to enter at least one of the first vent and the second vent of the television,
   the first protrusion comprises a first end having a first forwardly curved portion that curves away from the base, and
   the second protrusion comprises a second end having a second forwardly curved portion that curves away from the base.

7. The mounting system of claim 6, wherein the first hook comprises a V-shaped intermediary section that couples the back portion to the first and second protrusions.

8. The mounting system of claim 1, wherein the first hook comprises a back portion coupled to the base, and
   wherein the first front portion is coupled to the back portion by an intermediary section of the first hook such that the first hook comprises a serpentine shape, wherein the first front portion comprises a first end of the serpentine shape, and wherein the back portion comprises a second end of the serpentine shape.

9. The mounting system of claim 8, wherein the first front portion of the first hook comprises a back profile, a front profile, an approach angle, a thickness, and a width, wherein the thickness is an average linear distance between the back profile and the front profile, and the width is perpendicular to the thickness,
   wherein the thickness is at least 50 percent larger than the width, and
   wherein the approach angle is less than 40 degrees.

10. The mounting system of claim 8, wherein the first hook comprises an end portion having a forwardly curved portion that curves away from the base while the first hook is coupled to the base.

11. The mounting system of claim 1, wherein the first front portion of the first hook comprises a back profile, a front profile, an approach angle, a thickness, and a width, wherein the thickness is an average linear distance between the back profile and the front profile, and the width is perpendicular to the thickness,
   wherein the width is at least twice as large as the thickness, and the thickness is less than 4 millimeters, and
   wherein the approach angle is less than 40 degrees.

12. The mounting system of claim 1, wherein the second hook comprises a second serpentine shape, wherein the first hook comprises a first serpentine shape, wherein the first serpentine shape of the first hook comprises a first back end and a first front end, and wherein the second serpentine shape of the second hook comprises a second back end and a second front end,
   wherein the first front end and the second front end are configured to enter at least one of the first vent and the second vent of the television,
   wherein the base comprises a left side and a right side, wherein the left side of the base comprises a first opening having a first outer perimeter, and the right side of the base comprises a second opening having a second outer perimeter,
   wherein the first serpentine shape engages the first outer perimeter to couple the first hook to the base, and
   wherein the second serpentine shape engages the second outer perimeter to couple the second hook to the base.

13. A mounting system configured to mount a digital media player to a television having a first vent and a second vent, wherein the television is configurable to display images based on digital signals from the digital media player, the mounting system comprising:
   a base coupled to the television;

a first sidewall coupled to the base;

a second sidewall coupled to the base, wherein the first sidewall and the second sidewall are configured to couple the digital media player to the base;

a first hook configured to couple the base to the television, wherein the first hook comprises a first back portion and a first front portion, wherein the first front portion is coupled to the first back portion by a first intermediary section of the first hook such that the first hook comprises a first serpentine shape, wherein the first front portion comprises a first end of the first serpentine shape, and wherein the first back portion comprises a second end of the first serpentine shape, wherein a first end portion of the first serpentine shape comprises a first curved portion that curves away from the first intermediary section; and a second hook configured to couple the base to the television, wherein the second hook comprises a second back portion and a second front portion, wherein the second front portion is coupled to the second back portion by a second intermediary section of the second hook such that the second hook comprises a second serpentine shape, wherein a second end portion of the second serpentine shape comprises a second curved portion that curves away from the second intermediary section.

14. The mounting system of claim 13, further comprising a first retaining lip coupled to the first sidewall and a second retaining lip coupled to the second sidewall, wherein the first retaining lip and the second retaining lip are configured to engage a surface of the digital media player to couple the digital media player to the base, wherein the first retaining lip protrudes towards the second retaining lip, and wherein the second retaining lip protrudes towards the first retaining lip.

15. The mounting system of claim 13, wherein the first front portion of the first hook is narrower than the first back portion such that the first front portion is configured to enter the first vent of the television to couple the base to the television.

16. The mounting system of claim 13, wherein the first sidewall and the second sidewall are coupled at opposite ends of the base, and wherein the base comprises a first opening and the first back portion of the first hook is coupled to a perimeter of the first opening of the base, wherein the first opening is wider than the first back portion.

17. The mounting system of claim 13, wherein the first hook is located at least partially inside of the first vent to couple the base to the television while the digital media player is coupled to the base, and wherein the first hook comprises an approach angle of less than 40 degrees.

18. The mounting system of claim 13, wherein the first front portion of the first hook and the second front portion of the second hook are configured to enter at least one of the first vent and the second vent of the television, wherein the base comprises a left side and a right side, wherein the left side of the base comprises a first opening having a first outer perimeter, and the right side of the base comprises a second opening having a second outer perimeter, wherein the first serpentine shape engages the first outer perimeter to couple the first hook to the base, and wherein the second serpentine shape engages the second outer perimeter to couple the second hook to the base.

19. The mounting system of claim 13, wherein the first back portion of the first hook comprises a section that protrudes towards the first front portion.

20. The mounting system of claim 1, wherein the base comprises a first opening and a second opening, wherein the first opening and the second opening are located at least partially between the digital media player and the television, wherein the first hook comprises a first back portion that couples the first hook to the base, and the first back portion enters the first opening such that the first hook couples the base to the television, and wherein the second hook comprises a second back portion that couples the second hook to the base, and the second back portion enters the second opening such that the second hook couples the base to the television.

* * * * *